United States Patent [19]

Levine et al.

[11] Patent Number: 4,691,076

[45] Date of Patent: Sep. 1, 1987

[54] SOLAR ARRAY WITH ALUMINUM FOIL MATRIX

[75] Inventors: Jules D. Levine, Dallas; Millard J. Jensen, Balch Springs; Ronald E. Haney, Richardson, all of Tex.

[73] Assignee: Texas Instruments Incorporated, Dallas, Tex.

[21] Appl. No.: 937,473

[22] Filed: Dec. 2, 1986

Related U.S. Application Data

[63] Continuation of Ser. No. 820,904, Jan. 16, 1986, abandoned, which is a continuation of Ser. No. 647,942, Sep. 4, 1984, abandoned.

[51] Int. Cl.$^4$ ............................................. H01L 27/14
[52] U.S. Cl. ........................................ 136/250; 437/2; 437/51
[58] Field of Search ....................... 136/250; 29/572

[56] References Cited

U.S. PATENT DOCUMENTS 4,407,320 10/1983 Levine .................. 136/250

FOREIGN PATENT DOCUMENTS 51-04985 1/1976 Japan ..................... 29/572

Primary Examiner—Aaron Weisstuch
Attorney, Agent, or Firm—Carlton H. Hoel; Leo N. Heiting; Melvin Sharp

[57] ABSTRACT

The disclosure relates to a method of making solar cell arrays and modules and the arrays and modules wherein the arrays are formed of semiconductor spheres of P-type interior having an N-type skin housed in a pair of aluminum foil members which form the contacts to the P-type and N-type regions. The foils are electrically insulated from each other and are flexible. Multiple arrays can be interconnected to form a module of solar cell elements for converting light energy into electrical energy.

12 Claims, 6 Drawing Figures

SOLAR ARRAY WITH ALUMINUM FOIL MATRIX

This application is a continuation, of application Ser. No. 820,904, filed Jan. 16, 1986 and now abandoned, which in turn is a continuation of application Ser. No. 647,942 filed Sept. 4, 1984 and now abandoned.

CROSS-REFERENCE TO RELATED APPLICATIONS

The following copending patent applications disclose related subject matter: Ser. Nos. 647,551; 647,578; 647,579 (now U.S. Pat. No. 4,582,588); 647,601; 647,600; 647,580 (now U.S. Pat. No. 4,581,103); 647,606; and 647,605 (now abandoned in favor of 906,646 filed Sept. 11, 1986); all filed Sept. 4, 1984. All of these cross-reference applications are assigned to the assignee of the present application.

BACKGROUND OF THE INVENTION

1. Field of the Invention

This invention relates to a method of making solar cells from silicon spheres disposed in a metal foil matrix wherein the cells generate electricity upon exposure to light.

2. Description of the Prior Art

Systems for producing energy by conversion of the rays of the sun to other forms of useful energy are well known and such devices are constantly being developed and improved due to the economics of the sun being the primary source of energy involved. One such system is disclosed in U.S. Pat. No. 4,021,323 of Kilby et al. wherein a solar array composed of a transparent matrix such as glass or plastic is provided with particles of silicon of P-type with an N-type skin on one side thereof or N-type with a P-type skin on one side thereof embedded in the matrix. Preferably about half of the particles are P-type with N-type skin and the remainder are N-type with a P-type skin, though this arrangement can be altered. On the backside of the matrix, the silicon particles protruding therethrough are interconnected by appropriate electrically conductive metallization. The silicon particles have the skin portion thereof extending through the frontside of the matrix. These arrays are immersed in an electrolyte, preferably hydrobromic acid (HBr), that contacts the frontside of the matrix. Due to the potential difference between the silicon particles of different conductivity type contacting the electrolyte, a potential difference therebetween is set up under sunlight which electrolyzes the HBr into hydrogen gas which bubbles off and bromine which remains in solution. The hydrogen gas is collected and is a source of energy, for example, in fuel cells and the like as is well known.

In solar arrays of this type, the silicon particles participate in the electrolysis independently. As a result, the rate at which reaction products are generated by an array will not be significantly affected if the P-N junctions in a few particles are shorted or shunted.

Another system for producing useful energy from the sun's rays uses an array similar to the kind described above but configured so as to generate electricity rather than perform electrolysis. One such system is disclosed in U.S. Pat. No. 2,904,613. Although alternate arrangements are possible, a useful embodiment comprises a transparent matrix such as glass or plastic provided with particles of N-type silicon with a P-type skin. The N-type cores of the particles protrude through the backside of the matrix and are interconnected by appropriate electrically conductive metallization. The P-type skins protrude through the frontside of the matrix and are interconnected with an electrically conductive light transmissive material such as tin oxide on a fine metal gridwork. Under sunlight, a potential difference is set up between the backside and frontside interconnections of such an array which can be suitably connected so as to power an external electrical load directly.

An improvement over this prior art is set forth in the application of Kent R. Carson, Ser. No. 562,782, filed Dec. 15, 1983 (TI-9744) and now abandoned, wherein refinements and improvements to the above noted inventions were made. However, in the present state of the art, the cost of producing solar arrays in accordance with the above described prior art is relatively uneconomical and this prior art approach has not shown a great measure of economic success to date. It is therefore imperative, in order to provide economically viable solar arrays, that such arrays be capable of relatively inexpensive fabrication.

SUMMARY OF THE INVENTION

In accordance with the present invention, there is provided a method of producing solar arrays wherein the above noted problems in the prior art are materially reduced and wherein a solar array can be produced relatively economically as compared with the cited prior art.

Briefly, in accordance with the present invention, a solar array is formed by providing a first sheet of flexible aluminum foil of standard type which would likely have a native aluminum oxide on the surface thereof. The foil is embossed in those locations wherein silicon spheres are to be positioned to form a metal matrix. The foil is then cleaned of organics and etched to remove those thin areas where embossments were located to create apertures therein and provide locations thereby for insertion of the silicon spheres. An additional etching step is used to provide a matte surface on the foil. The foil forms the housing for the spheres which are to be applied thereto as well as the front contact therefor. The silicon spheres, having an N-type skin over the P-type interior are deposited over the backside of the foil and a vacuum chuck is provided on the frontside of the foil to suck the spheres against and partially into the apertures in the foil previously formed to cut off the passage of air through the apertures. Since an excess number of spheres is initially utilized relative to the number of apertures, all of the apertures will eventually be filled with spheres and the unused spheres are then removed by brushing or the like of the back surface of the foil.

The silicon spheres are then bonded to the aluminum foil by use of an impact press which drives the spheres into the apertures With the equators of the spheres being positioned forward of the foil and on the front side (side toward the sun or light) of the foil. This forcing of the spheres into the apertures under high force causes a tearing of the aluminum at the surfaces contacted by the silicon spheres and exposes fresh aluminum thereat. The shear caused by the movement of the silicon spheres relative to the aluminum also scrapes off the surface aluminum oxide to cause such exposed fresh aluminum. This action also removes substantially all of the silicon oxide from the portion of the sphere which contacts the aluminum foil and, in particular, the exposed aluminum. This action takes place with the aluminum at a temperature in the range of about 500° C. to less than 577° C. at which time the aluminum is solid but easily deformable whereas the silicon is still a rigid body at this temperature. (Temperatures above 577° C. are possible if the impact is of short enough duration). The fresh aluminum attacks the silicon dioxide and substantially removes it at the impact locations during impact. In this way, a bond between the silicon and the aluminum is provided to form an aluminum contact to the silicon N-type skin layer. The array of foil and spheres is then cooled to ambient temperature to allow the foil to reharden.

The backside of the foil with exposed spheres is then etched to remove the N-type skin thereat since the aluminum foil acts as a mask for the silicon etchant, the foil itself not being very reactive due to the very thin native oxide coating normally formed thereon. The array is then anodized by placing it in a sulfuric acid bath (about 10% $H_2SO_4$) for about ½ minute to provide an oxide coating on the aluminum. Next, another anodizing bath is used, the bath containing ½ of 1% $H_3PO_4$ to seal the aluminum and anodize the silicon. There is about 10 μm of $Al_2O_3$ and 0.1 μm of $SiO_2$ grown in this manner. The back surfaces of the spheres are then lapped to provide a surface for making contact thereto. The lapping process roughens the surfaces so that a good ohmic contact will form. A thin aluminum second foil is then applied to the lapped surfaces and, after preheating to a temperature in the range of 500° C. to less than 577° C., the foil is impact pressed against the lapped regions and forms a contact therewith.

In the event the arrays are to be formed in a reel to reel embodiment, shims are placed between the two foils in a location between adjacent arrays prior to bonding the second foil to the spheres. In this embodiment, the upper and lower foil are forced against but not bonded to the shims while bonding of the second foil to spheres. The foils are then appropriately scribed over the shims on both sides of the array to provide a foil extension portion for each foil on opposite sides of the array. The foil extensions can then be connected together in series circuit relation to form an enlarged circuit.

The arrays with shims therein as above can also be scribed, separated from each other and chamfered so that only one side of the rectangular array has an outwardly extending second foil portion in the form of a contact. These contacts are connected to the first foil portions of other arrays in any geometric configuration to provide a module with input and output.

The result is a solar array with the predominant portion of each of the silicon spheres disposed on the frontside of the array to provide an increased amount of surface available for receipt of rays of the sun. Furthermore, as is apparent, the array is flexible, has a light reflector in the aluminum foil and has been provided by utilizing a relatively small number of inexpensive materials and processing steps.

DESCRIPTION OF THE PREFERRED EMBODIMENT

Figure 1:
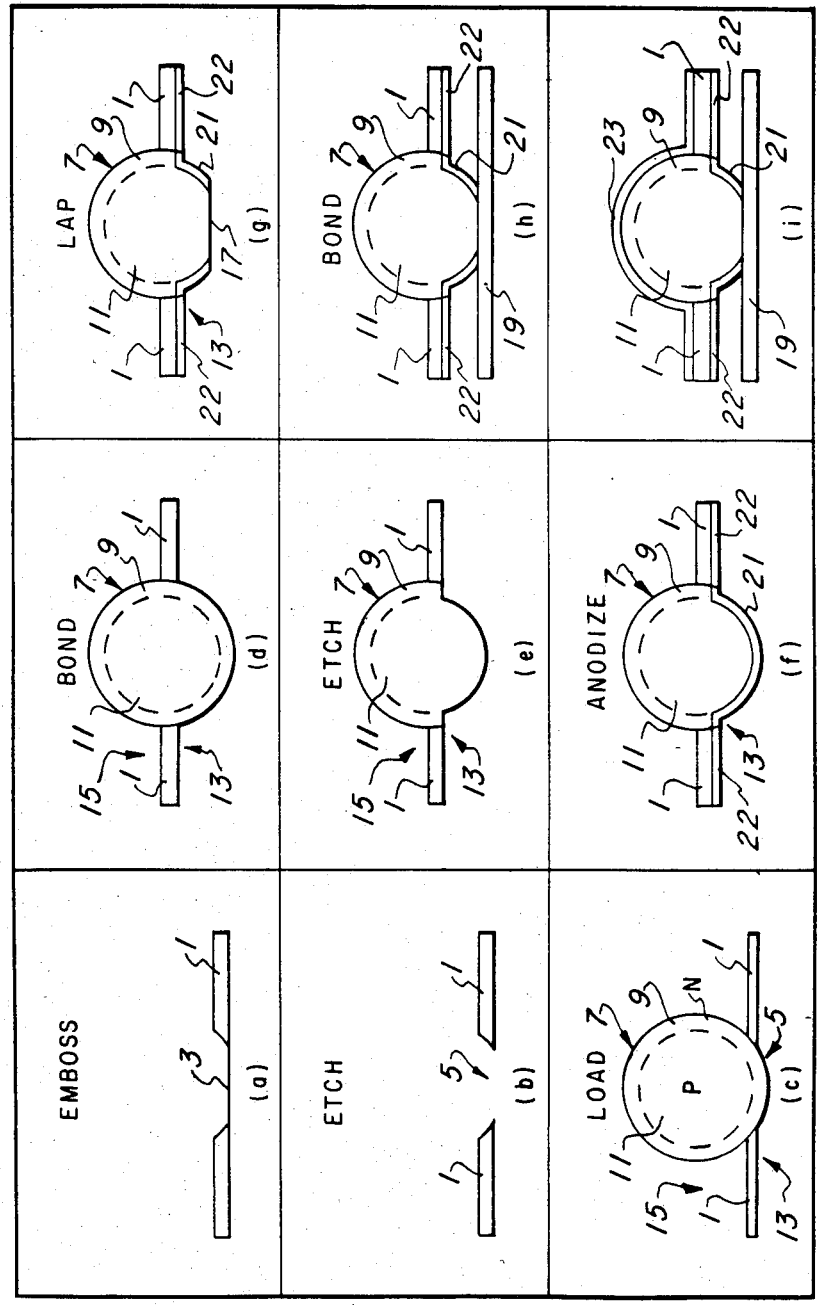
FIG. 1 is a schematic diagram of the processing steps utilized in forming a solar array in accordance with the present invention.
Figure 2:
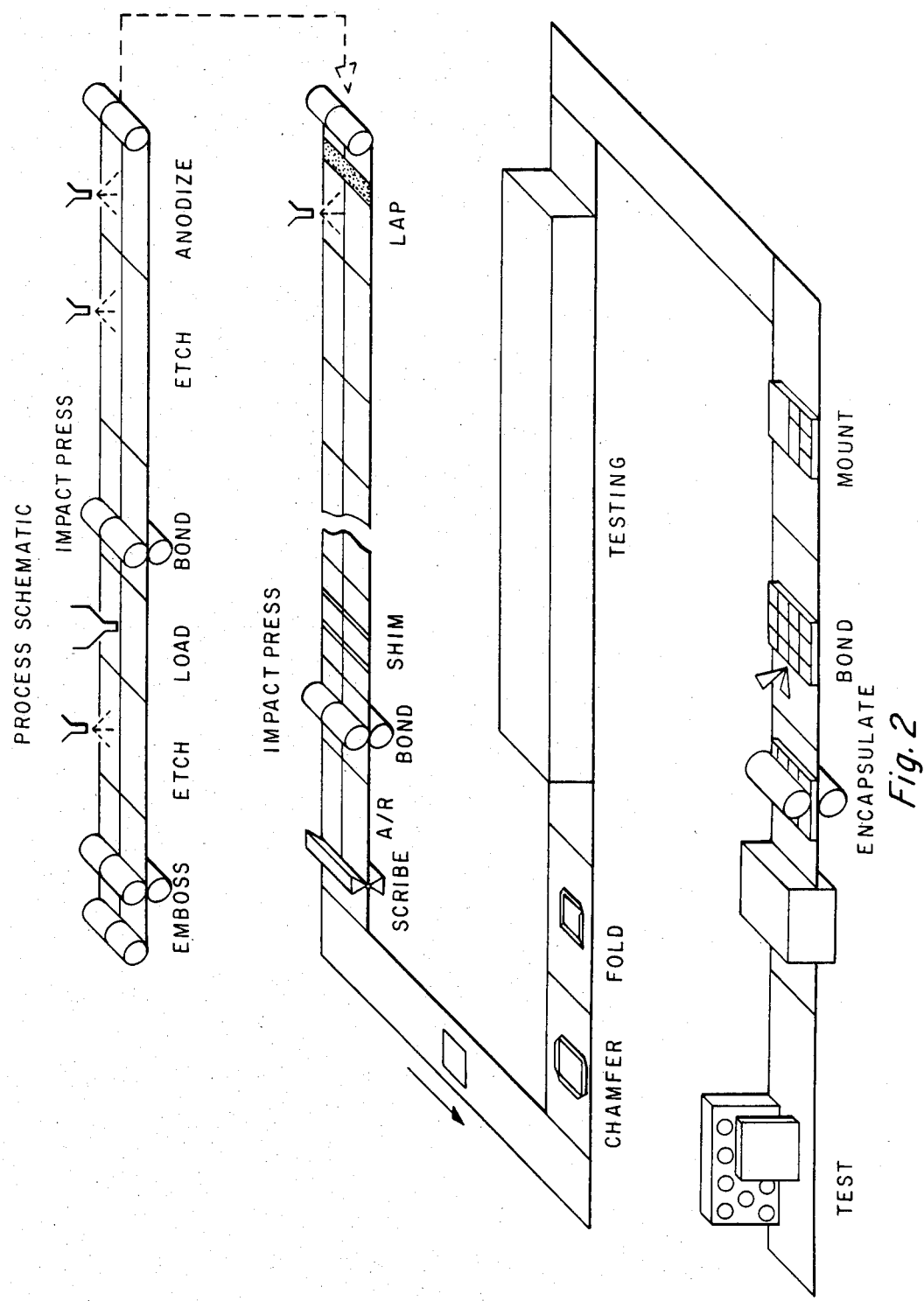
FIG. 2 is a process schematic diagram of the process of FIG. 1.

Referring now to FIGS. 1 and 2, there is shown a schematic diagram of the processing steps utilizing the features of the present invention for forming the solar array in accordance with the present invention. Initially, an aluminum foil 1 of about 2 mil thickness is provided which is flexible and which would normally include a very thin native oxide layer on its surface from normal exposure to the environment. While the description herein will be with respect to a single solar array member, it should be understood that a multiplicity of array members is provided in the total array as is exemplified by the prior art noted hereinabove.

The aluminum foil 1 is initially embossed as shown in (a) in a periodic hexagonal arrangement, for example, 16 mil centers with the reduced thickness embossment 3 being of slightly smaller diameter than the diameter of the spheres to be disposed therein. The embossments can be circular or of other geometrical shapes, such as hexagonal. In the case of a polygonal shape of the embossment, a line across the polygon through its center will be less than the diameters of the spheres to be applied thereto. The foil is then cleaned to remove organics and then etched as shown in (b) with heated sodium or potassium hydroxide to remove the region of the foil where the embossment 3 was made and to provide an aperture 5 in its place. The embossed region 3 is removed prior to the remainder of the foil during etching because it is thinner than the remainder of the foil and also etches faster because it has been cold worked due to the embossment that has taken place therein. This is called an aluminum matrix.

At this point the foil can optionally be textured by etching with a 50% solution of 39A etchant which is 25% HF, 60% $HNO_3$ and 15% glacial acetic acid to provide a matrix surface that minimizes back reflections.

A plurality of spheres of silicon 7 as shown in (c) having an N-type skin 9 and a P-type interior 11 are deposited over the backside 13 of the matrix on the foil 1 and a vacuum is provided at the front side 15 of the foil with a vacuum chuck to draw the spheres 7 into the apertures 5. Since an excess of spheres 7 relative to the number of holes 5 is initially utilized on the foil backside, all of the holes will be filled with a sphere 7 and the excess spheres 7 are then removed from the backside of the foil 1 by brushing or the like. The spheres utilized therein are preferably 14.5 mils in diameter and the apertures 5 as stated above, have a cross sectional diameter of less than 14.5 mils to provide a vacuum with the foil at the foil frontside for reasons to be made clear hereinbelow.

The spheres 7 are then bonded to the aluminum foil 1 within the apertures 5 as shown in (d) by heating the foil and use of an impact press wherein the spheres 7 are forced quickly into the apertures 5 and cause a shearing action within the apertures which scrapes off aluminum oxide at the interior surfaces of the foil at the apertures and exposes fresh elemental aluminum. As stated, the aluminum has been heated to a temperature of about 530° C. at the time the spheres 7 are forced into the apertures 5 so that the aluminum is reactive and somewhat viscous in mechanical properties and easily deformed. The elemental aluminum therefore reacts with the very thin native silicon oxide layer on the spheres and removes it so that the aluminum in the foil 1 is now able to bond directly to the elemental silicon in the N-type layer 9 of the sphere to form a contact thereto.

The sphere 7 is disposed in the aperture 5 so that the equator thereof is forward of the aluminum foil 1 or on the frontside 15 thereof. This arrangement is made possible by the use of pressure pads which are disposed above and below the aluminum foil 1, the pressure pads being formed of aluminum foil about 8 mils thick coated with a release agent, such as boron nitride powder, which acts as a cushion so that the hammer of the impact press does not injure the spheres during impact. In addition, the pressure pads absorb the shock of the hammer. The top pressure pad, on the side 13 of the foil 1, is thicker than the bottom pressure pad on the side 15 of the foil 1 to provide the offset of the sphere equator from the foil 1 as stated hereinabove. An impact energy of about 48 foot-pounds for a 2 centimeter square array has been found to operate successfully. Accordingly, the aluminum is now bonded directly to the silicon as stated above.

The rear surface 13 of the foil 1 and the portion of the sphere 7 on that side is then etched using 39A etchant (approxcimately 15% acetic acid, 25% HF, and 60% $HNO_3$) as shown in (e) to remove the portion of the N-type layer 9 on the back surface of the array and expose the P-type region. The aluminum foil 1 with native oxide thereon acts as a mask to the etchant and only permits the portion of the layer 9 to the rear side of 13 of the array to be removed. The array is then rinsed with deionized water to remove etchant and the array is then anodized as is shown in (f) to passivate the exposed silicon and foil in a 10% $H_2SO_4$ solution for about $\frac{1}{2}$ minute at about 20 volts. The array is then anodized in a 0.5% $H_3PO_4$ solution for about $\frac{1}{2}$ minute at about 20 volts. The time required for anodization is a function of when the current in the bath goes to zero and shuts off, this having been found to be about $\frac{1}{2}$ minute. The use of the phosphoric acid is essential and has been found to close holes in the aluminum oxide and provide a silicon dioxide layer 21 of about 1,000 angstroms on the silicon surface which, was previously etched, as well as a thick aluminum oxide layer 22 on the back side of aluminum foil 1.

The spheres 7 of the anodized array are then lapped by mechanical abrading in well known manner on the backside silicon dioxide layer 21 formed during anodization. This lapping removes both the silicon dioxide 21 and some silicon to level the back surface of the sphere 7 and provide a rough back surface 17 so that ohmic contacts can be formed thereon. A thin foil 19 of aluminum of about $\frac{1}{2}$ mil is then positioned over the roughened back surface 17 of each of the spheres 7 as shown in (h) so that it lies over the lapped flat regions 17, the aluminum being heated to a temperature of about 530° C., preferably, and in the range from about 500°–577° C. with the proviso noted above. The heated foil 19 is then pressed against the spheres 7 by means of an impact press and a bond between the aluminum therein which becomes exposed due to the impact and the silicon that has been exposed on the back surface of the spheres 7 due to the lapping and the impact with elemental aluminum is formed. Contact of foil 19 to silicon region 11 is formed by bonding in the same manner as described above with reference to (d). Due to the anodization of the aluminum foil 1, the surfaces of said foil have a thick aluminum oxide layer 22 thereon to thereby prevent any short circuiting between the foil 1 and the foil 19. (A standard antireflection coating 23 can be applied over the front surface of the array as shown in (i), to improve the optical absorption of the silicon). Accordingly, it can be seen that there has been provided a solar array wherein a major portion of the silicon sphere is exposed to the incoming rays of the sun, wherein the array is flexible and wherein the processing utilized and the materials utilized are relatively inexpensive and few in number.

In actual processing procedures, the array as disclosed hereinabove can normally be provided in a reel-to-reel embodiment rather than as separate arrays. The arrays will then be formed into modules which may be, for example, one meter by two meters in size and then tested in such design. Each array formed in the manner noted hereinabove would normally be on the order of 10 centimeters on each side.

Figure 3:
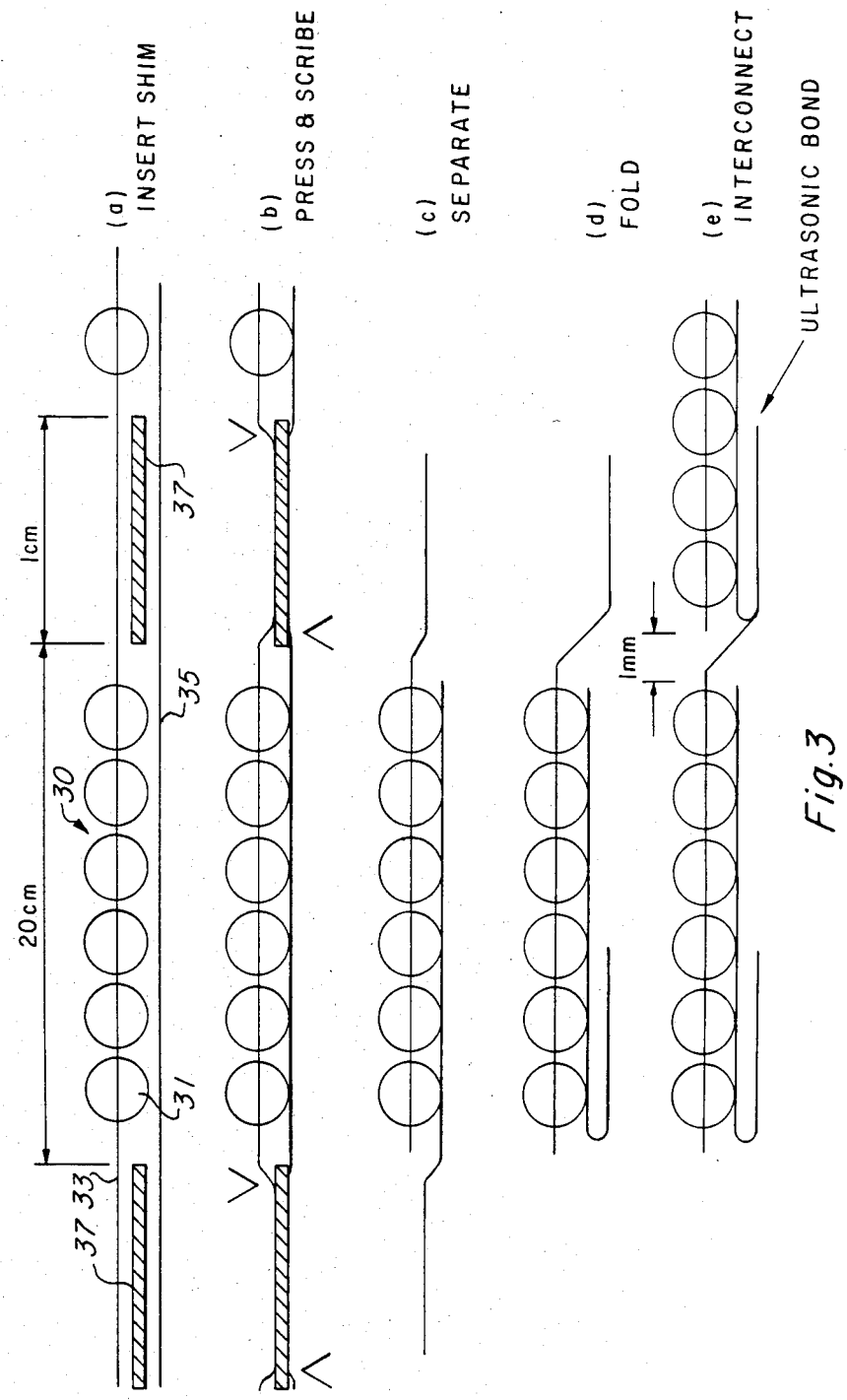
FIG. 3 is a schematic diagram of an array interconnect procedure in a one dimensional representation.
Figure 4:
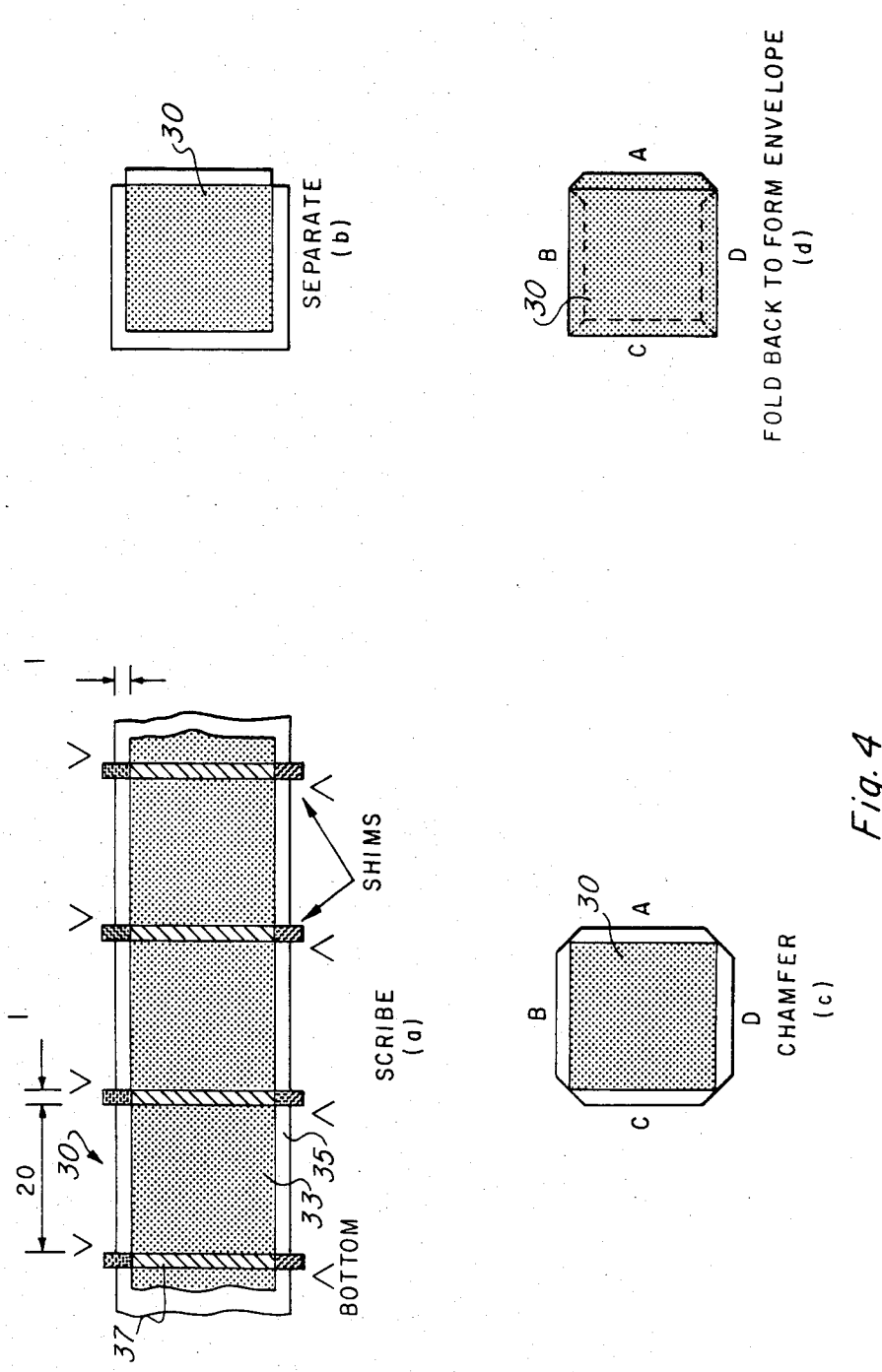
FIG. 4 is a schematic diagram of an array interconnect procedure in a two dimensional representation.

To provide the solar array described hereinabove in reel-to-reel form and then form modules therefrom, a procedure will be followed as set forth in FIGS. 3 through 6. Referring first to FIG. 3, there is shown a one dimensional representation of an array interconnect system wherein, in FIG. 3(a), there is shown a single array 30 with spheres 31 secured in the front contact foil member 33 and with the back foil member 35 not yet attached to the spheres. Shims 37 are inserted between arrays 30 as more clearly shown in FIG. 4(a). As can be seen from FIG. 4(a), the front foil 33 will be of lesser dimension than the back foil 35 for reasons that will become apparent hereinbelow.

Referring now to FIG. 3(b), it can be seen that the back foil 35 is now in contact with the spheres 31 as well as with the shims 37, the top foil 33 also being in contact with the shims. This is accomplished during the step (h) of FIG. 1 wherein the back foil 35 is bonded to the spheres 31 as a portion of that process step. The foils 33 and 35 will not adhere to the shims 37 and merely be in contact therewith. The foils will then be scribed at the location of the V-shaped members of FIGS. 3(b) over the shims to provide an arrangement as shown in FIG. 3(c) and in FIG. 4(b) after the arrays have been separated from each other and the shims removed. The array as shown in FIGS. 3(c) and 4(b) is then chamfered as is shown in FIG. 4(c) to provide four tabs which are a portion of the back foil 35, these tabs being located on each side of the array square and being labelled A, B, C, and D. The tabs B, C, D, are then folded under the array as shown in FIGS. 3(d) and 4(d) and the array is then secured to a subsequent array by bonding the tab A to one of the tabs B, C or D of a subsequent array by ultrasonic bonding or the like as shown in FIG. 3(e).

Figure 5:
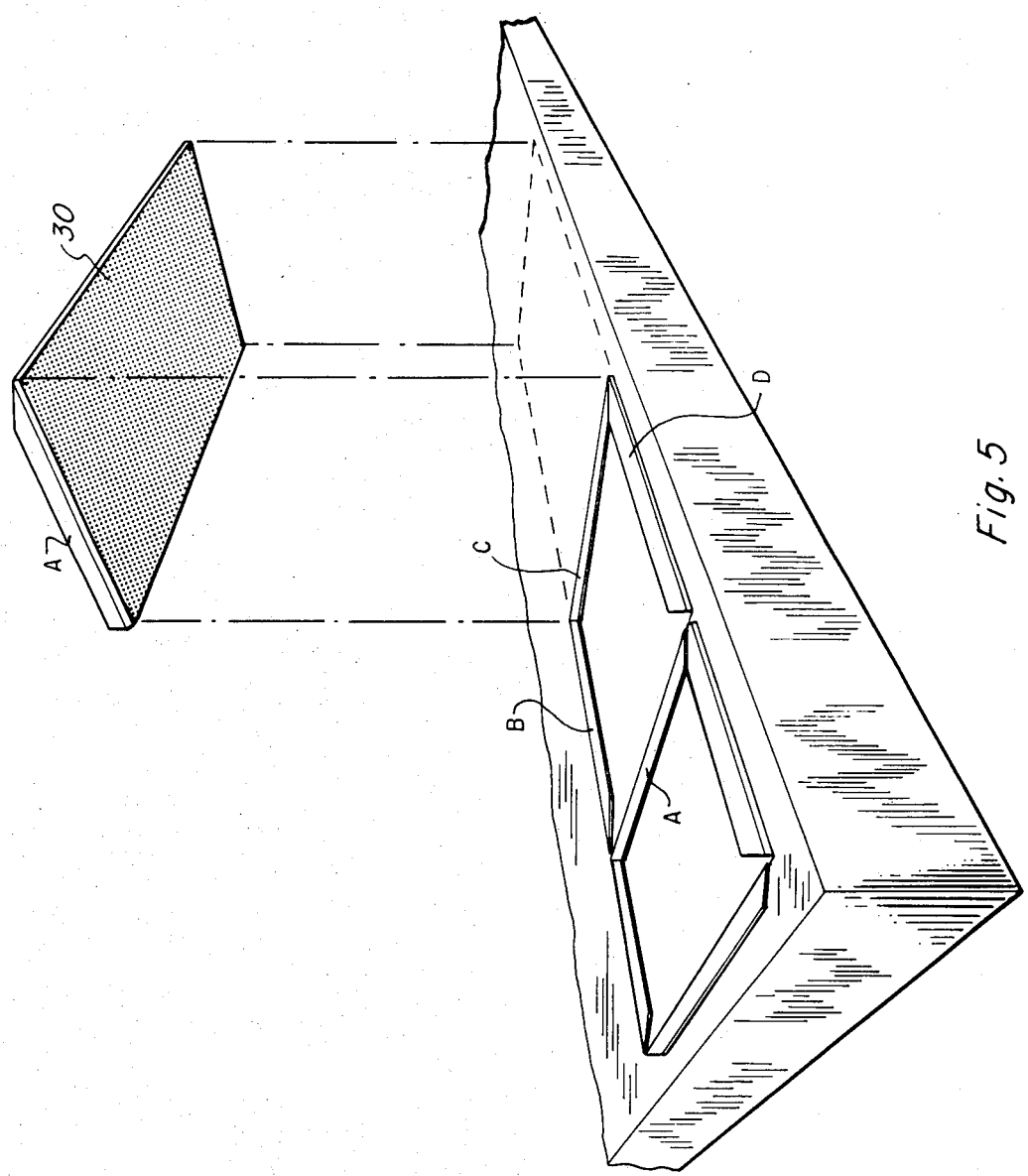
FIG. 5 is a schematic diagram of an array interconnect procedure in a three dimensional representation.
Figure 6:
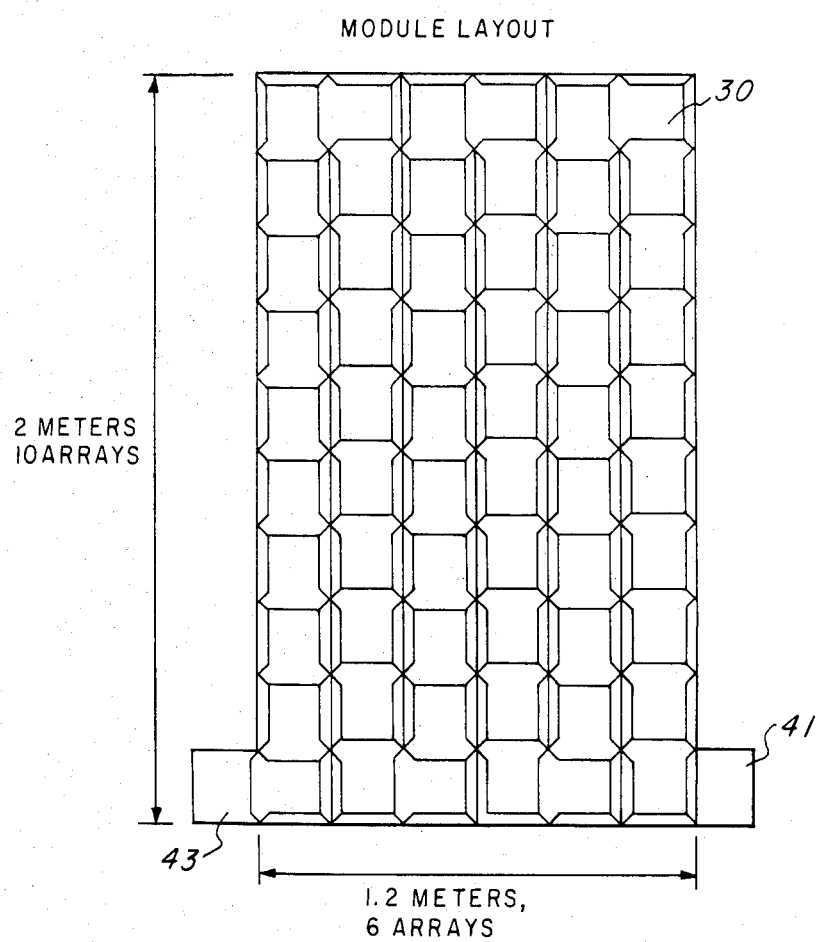
FIG. 6 is a diagram of a module in accordance with the present invention.

The interconnections step can be provided as shown in the three dimensional representation arrangement of FIG. 5 wherein one of the arrays with tab A extending therefrom is positioned so that the tab A contacts one of the tabs B, C, or D of a further array with this procedure being continued in a straight line or other path to provide a complete module. A completed module is shown in FIG. 6 wherein tabs A are secured to tabs B, C, or D of adjacent arrays 30 to provide a back and forth path which forms a series circuit of sixty such arrays. Also provided are tabs for input 41 and output 43 to the module.

After formation of the module of FIG. 6, with reference to FIG. 2, the module is tested and, if the test is successful, the module proceeds to be mounted on a backing material or the like and the tabs are then ultrasonically bonded together at a bonding station, after which the module is encapsulated to provide appropriate environmental sealing. The encapsulated module is then again tested in standard manner whereby an operational module is provided for use.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A solar array which comprises:
   (a) a first aluminum foil layer having a plurality of spaced apertures therein,
   (b) a plurality of discrete semiconductor members, each in a corresponding one of said apertures and having a P-type and an N-type region, the N-type region being ohmically bonded to said first aluminum foil, said bond characterized as formed by pressing said member into said corresponding aperture at a temperature in the range of from 500° to 577° C., and
   (c) a contact member insulated from said first foil and coupled to the P-type region.

2. A solar array as set forth in claim 1 wherein said contact member is a second aluminum foil.

3. A solar array as set forth in claim 2 wherein said semiconductor members are of spheroid shape.

4. A solar array as set forth in claim 3 wherein the equators of said semiconductor members are forward of the side of said first foil remote from said contact member.

5. A solar array as set forth in claim 4 further including an antireflective coating disposed on the surface of said first foil remote from said contact member.

6. A solar array as set forth in claim 3 further including an antireflective coating disposed on the surface of said first foil remote from said contact member.

7. A solar array as set forth in claim 2 further including an antireflective coating disposed on the surface of said first foil remote from said contact member.

8. A solar array as set forth in claim 1 wherein said semiconductor members are of spheroid shape.

9. A solar array as set forth in claim 8 wherein the equators of said semiconductor members are forward of the side of said first foil remote from said contact member.

10. A solar array as set forth in claim 9 further including an antireflective coating disposed on the surface of said first foil remote from said contact member.

11. A solar array as set forth in claim 8 further including an antireflective coating disposed on the surface of said first foil remote from said contact member.

12. A solar array as set forth in claim 1 further including an antireflective coating disposed on the surface of said first foil remote from said contact member.

* * * * *